United States Patent
Moslehi et al.

[11] Patent Number: 5,876,573
[45] Date of Patent: *Mar. 2, 1999

[54] HIGH MAGNETIC FLUX CATHODE APPARATUS AND METHOD FOR HIGH PRODUCTIVITY PHYSICAL-VAPOR DEPOSITION

[75] Inventors: Mehrdad M. Moslehi, Los Altos, Calif.; Dorian Heimanson, Rochester, N.Y.; Cecil J. Davis, Greenville; Thomas R. Omstead, Austin, both of Tex.

[73] Assignee: CVC, Inc., Rochester, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 677,951

[22] Filed: Jul. 10, 1996

Related U.S. Application Data

[60] Provisional application No. 60/008,852 Jul. 10, 1995.

[51] Int. Cl.$^6$ .................................................. C23C 14/34
[52] U.S. Cl. ........................ 204/192.12; 204/298.07; 204/298.09; 204/298.12; 204/298.19
[58] Field of Search ................... 204/298.07, 298.08, 204/298.09, 298.16, 298.17, 298.18, 298.19, 298.12, 192.12

[56] References Cited

U.S. PATENT DOCUMENTS

| | | | |
|---|---|---|---|
| 3,945,911 | 3/1976 | McKelvey | 204/298 |
| 4,169,031 | 9/1979 | Brors | 204/298.09 |
| 4,299,678 | 11/1981 | Meckel | 204/192 M |
| 4,361,749 | 11/1982 | Lord | 204/298.09 |
| 4,444,643 | 4/1984 | Garrett | 204/298.09 |
| 4,461,688 | 7/1984 | Morrison, Jr. | 204/192 R |
| 4,631,106 | 12/1986 | Nakazato et al. | 156/345 |
| 4,673,482 | 6/1987 | Setoyama et al. | 204/298 |
| 4,811,687 | 3/1989 | Prince | 204/298.09 |
| 4,872,964 | 10/1989 | Suzuki et al. | 204/298 |
| 5,079,481 | 1/1992 | Moslehi | 315/111.41 |
| 5,082,542 | 1/1992 | Moslehi et al. | 204/192.32 |
| 5,242,566 | 9/1993 | Parker | 204/298.2 |
| 5,252,194 | 10/1993 | Demaray et al. | 204/298.2 |
| 5,266,178 | 11/1993 | Sichmann | 204/298.08 |
| 5,282,947 | 2/1994 | Brugge et al. | 204/298.2 |
| 5,320,728 | 6/1994 | Tepman | 204/192.12 |
| 5,328,585 | 7/1994 | Stevenson et al. | 204/298.09 |
| 5,354,443 | 10/1994 | Molslehi | 204/192.12 |
| 5,433,835 | 7/1995 | Demaray et al. | 204/298.09 |
| 5,487,822 | 1/1996 | Demaray et al. | 204/298.09 |
| 5,529,627 | 6/1996 | Ocker et al. | 204/298.2 |
| 5,538,609 | 7/1996 | Hinterschuster et al. | 204/298.2 |
| 5,565,071 | 10/1996 | Demaray et al. | 204/298.07 |
| 5,628,889 | 5/1997 | Gardell et al. | 204/298.09 |

FOREIGN PATENT DOCUMENTS

| | | | |
|---|---|---|---|
| 0654543 | 11/1994 | European Pat. Off. | C23C 14/34 |
| 1177368 | 7/1989 | Japan | C23C 14/34 |
| 5132774(A) | 5/1993 | Japan | C23C 14/35 |
| 2125440 | 3/1984 | United Kingdom | C23C 15/00 |
| 9013137 | 11/1990 | WIPO | H01J 37/34 |
| WO 90/13137 | 11/1990 | WIPO | 204/298.2 |

OTHER PUBLICATIONS

PCT International Search Report; Mailing Date Sep. 22, 1997.

PCT International Search Report; Mailing Date Dec. 31, 1996.

PCT International Search Report, Mailing Date Dec. 12, 1996.

*Primary Examiner*—Nam Nguyen
*Assistant Examiner*—Rodney G. McDonald
*Attorney, Agent, or Firm*—Gary Cary Ware & Freidenrich, LLP

[57] ABSTRACT

A magnetron sputtering system is provided that uses cooling channels in the magnetron assembly to cool the target. The magnetron sputtering system also generates low pressure region in the magnetron assembly such that the backing plate sees a pressure differential much lower than atmospheric pressure. The backing plate is reduced in thickness and provides less of a barrier to the generated magnetic field.

34 Claims, 17 Drawing Sheets

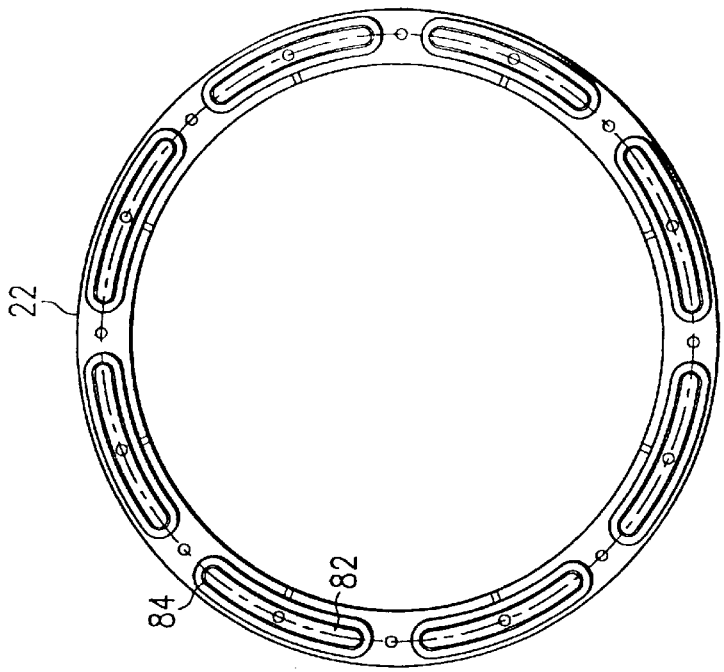
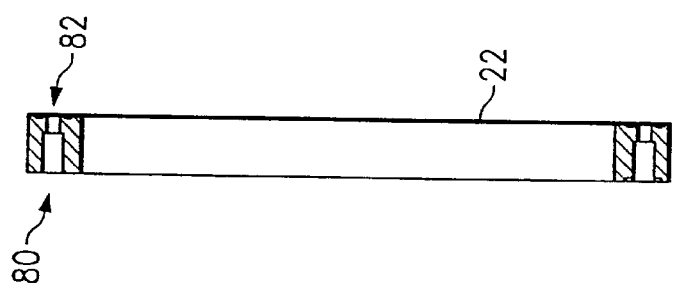
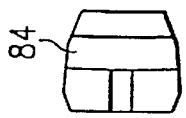
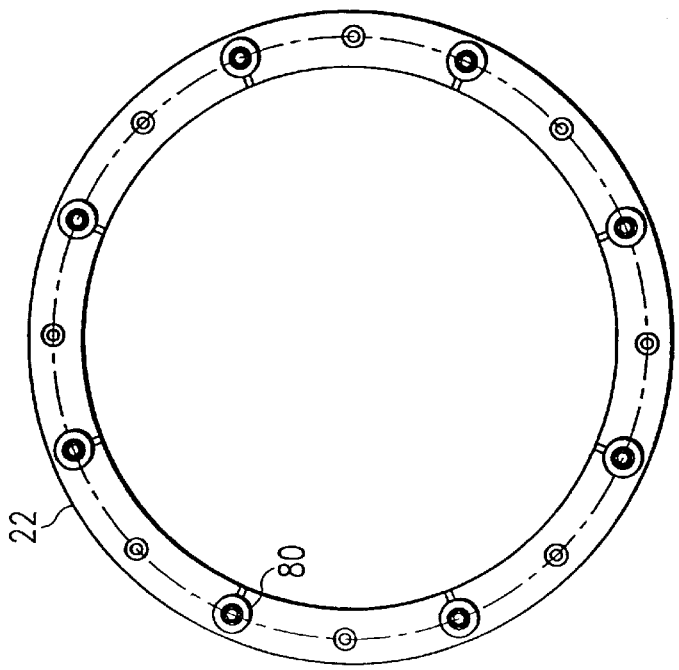
FIG. 4C
FIG. 4B
FIG. 4D
FIG. 4A

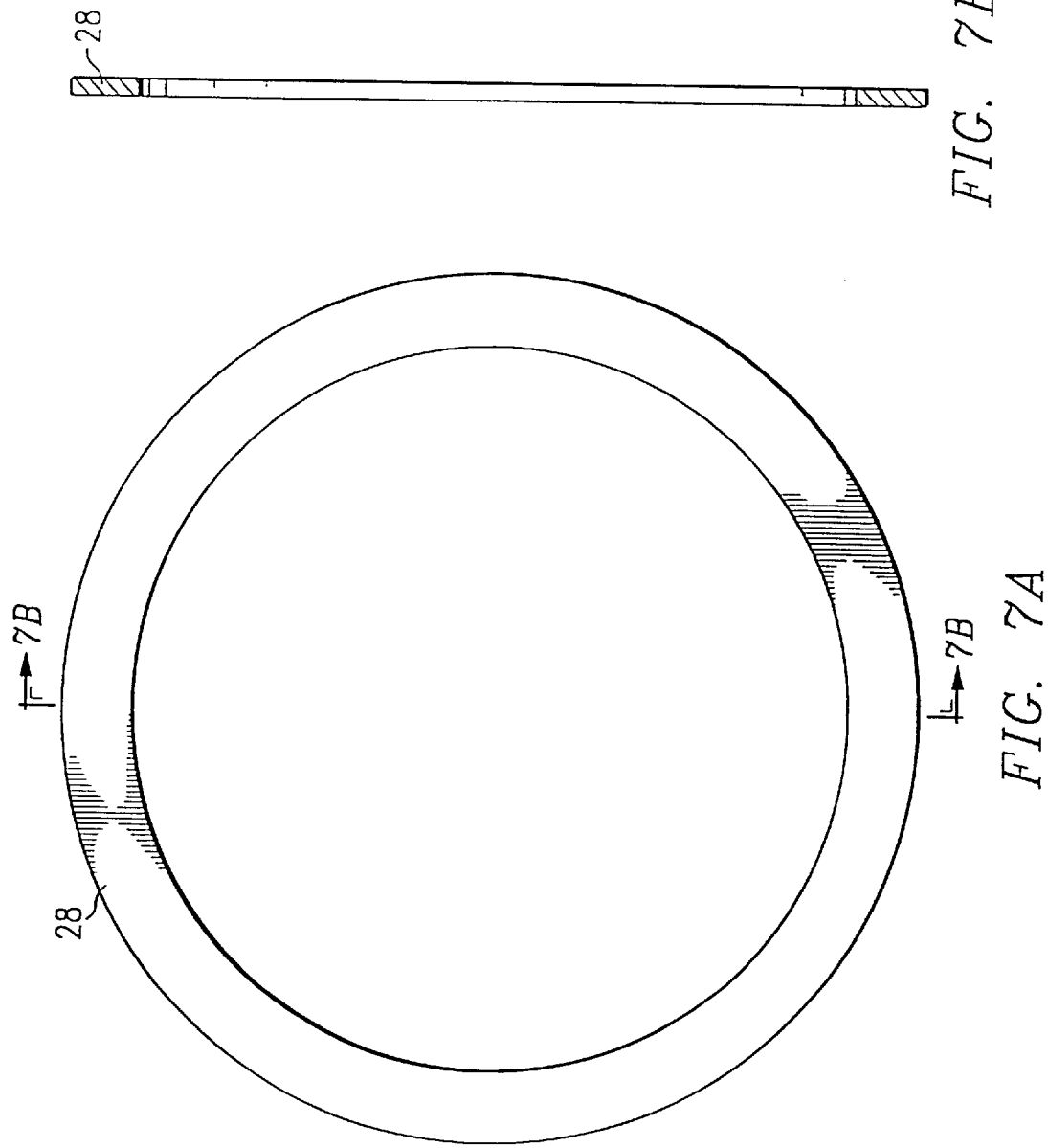

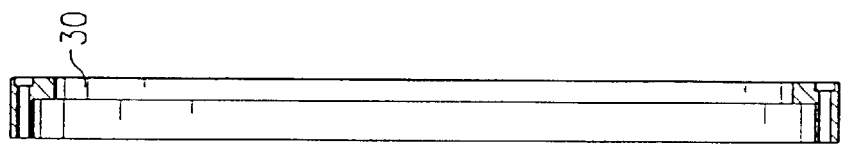
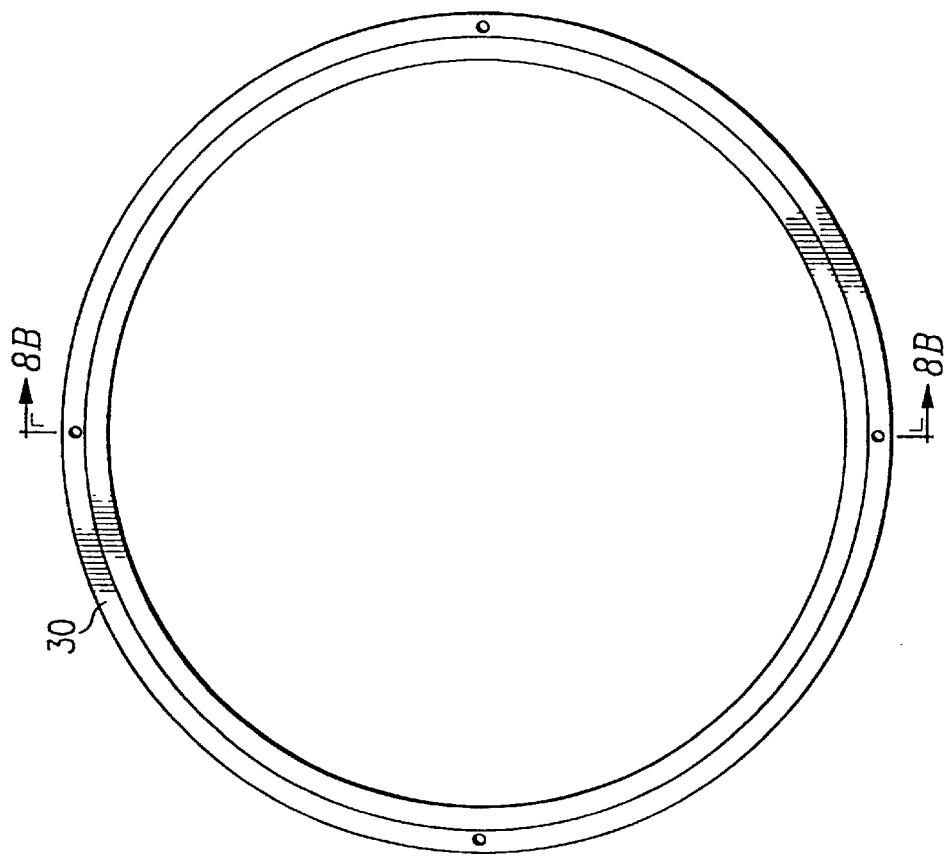

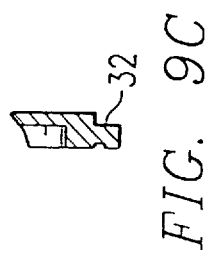
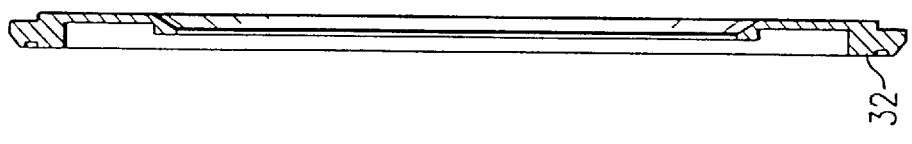
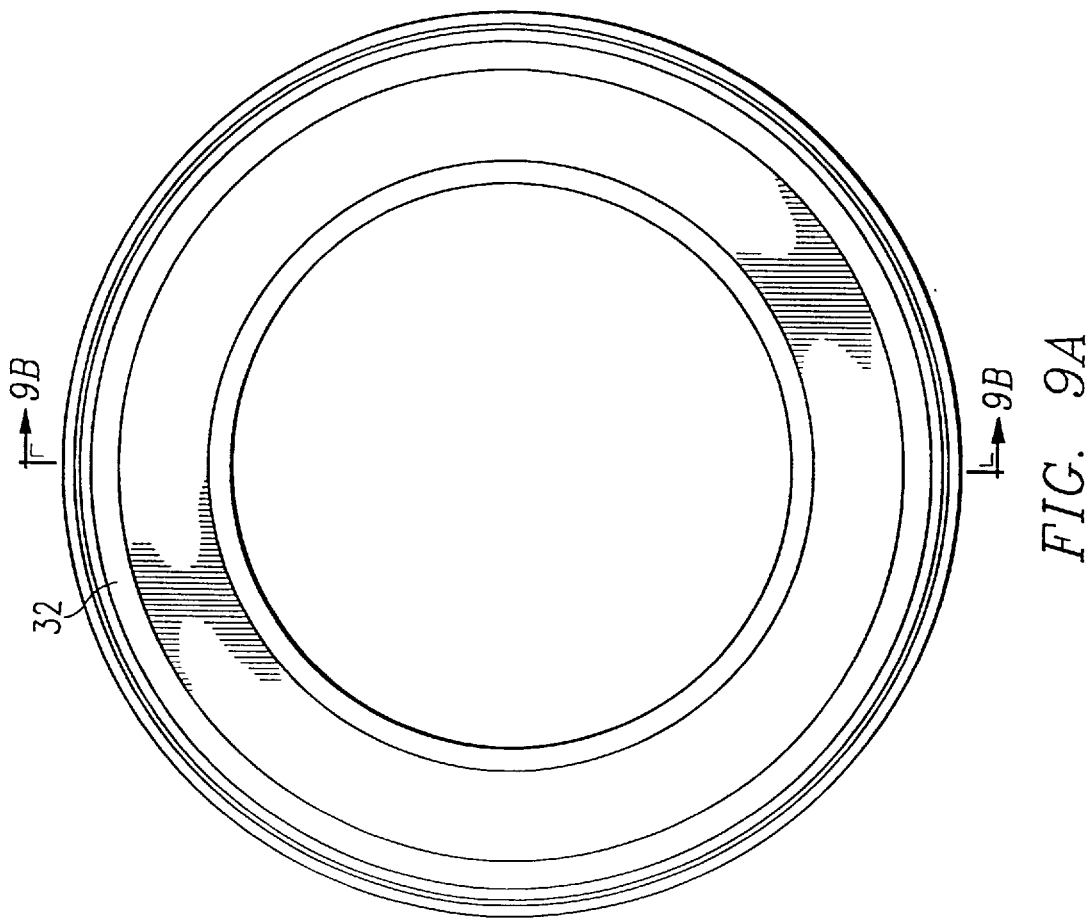

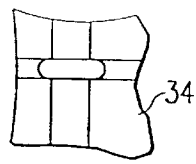
FIG. 10B
FIG. 10C
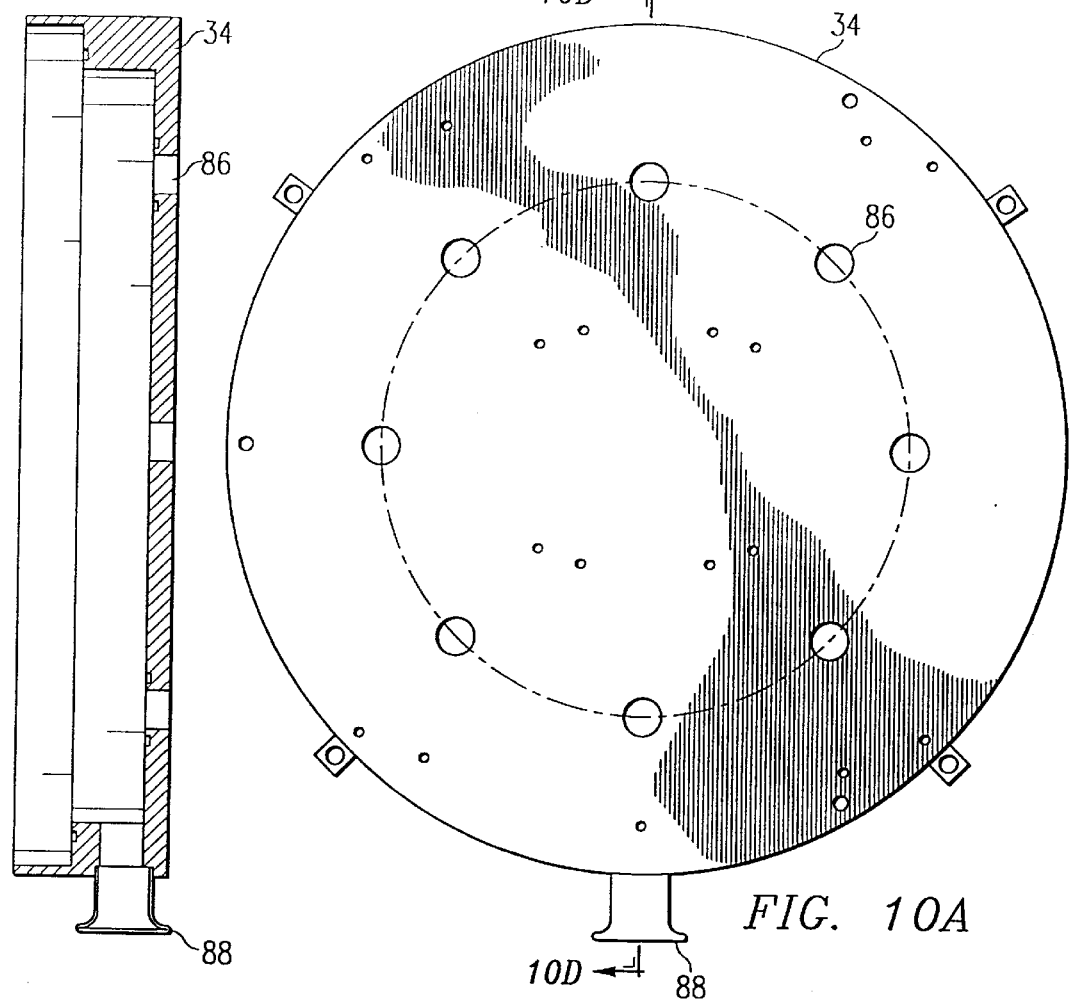
FIG. 10D
FIG. 10A
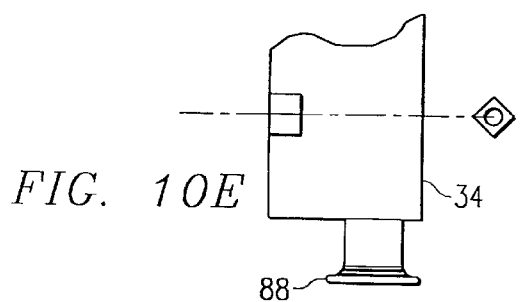
FIG. 10E

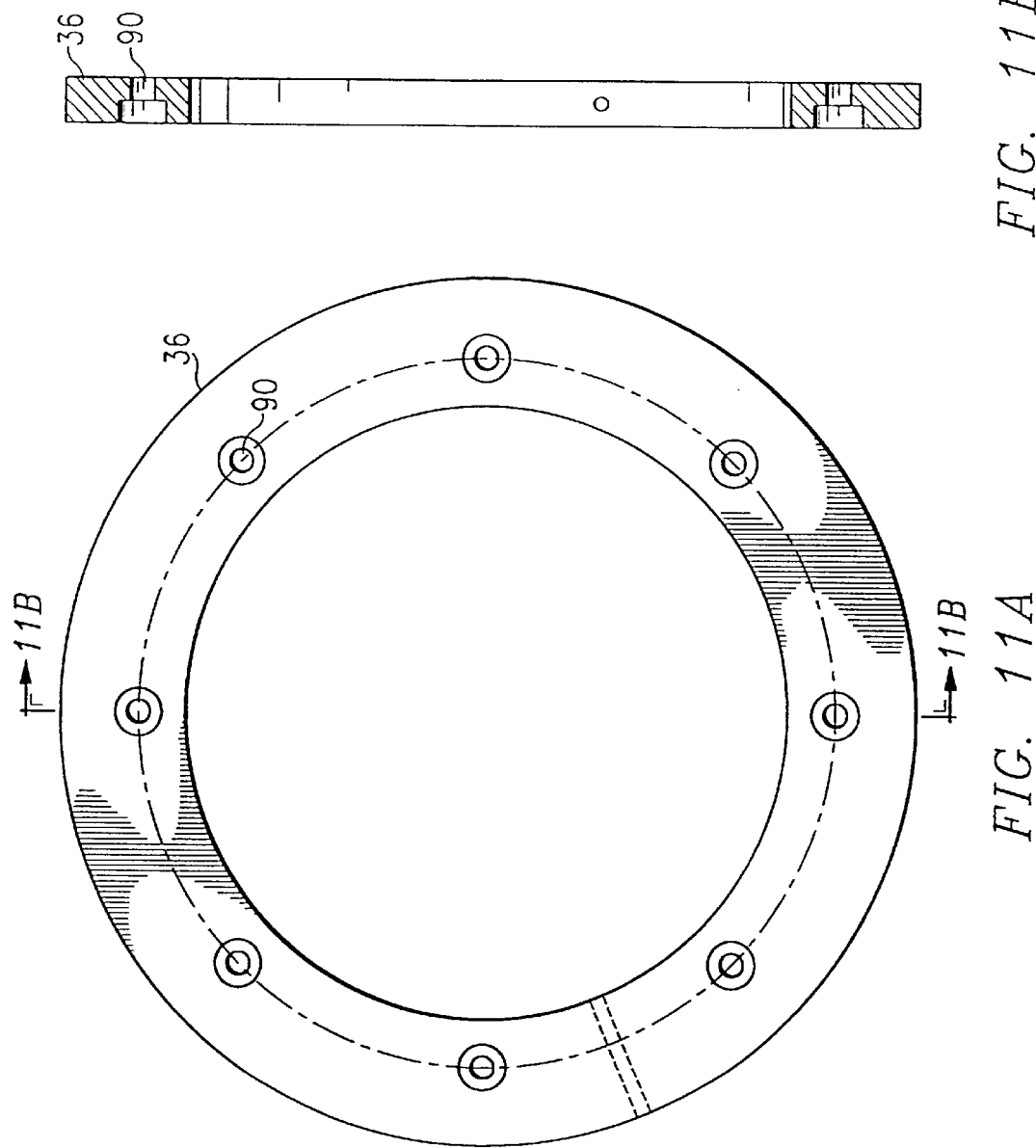

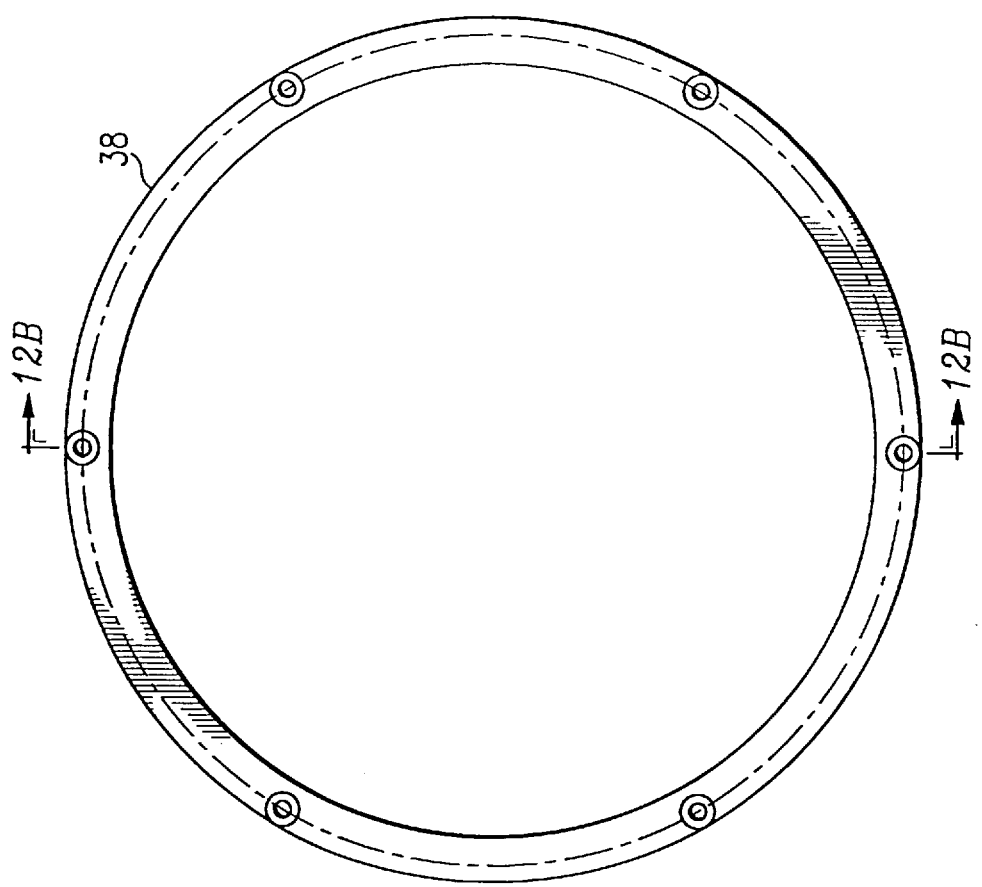

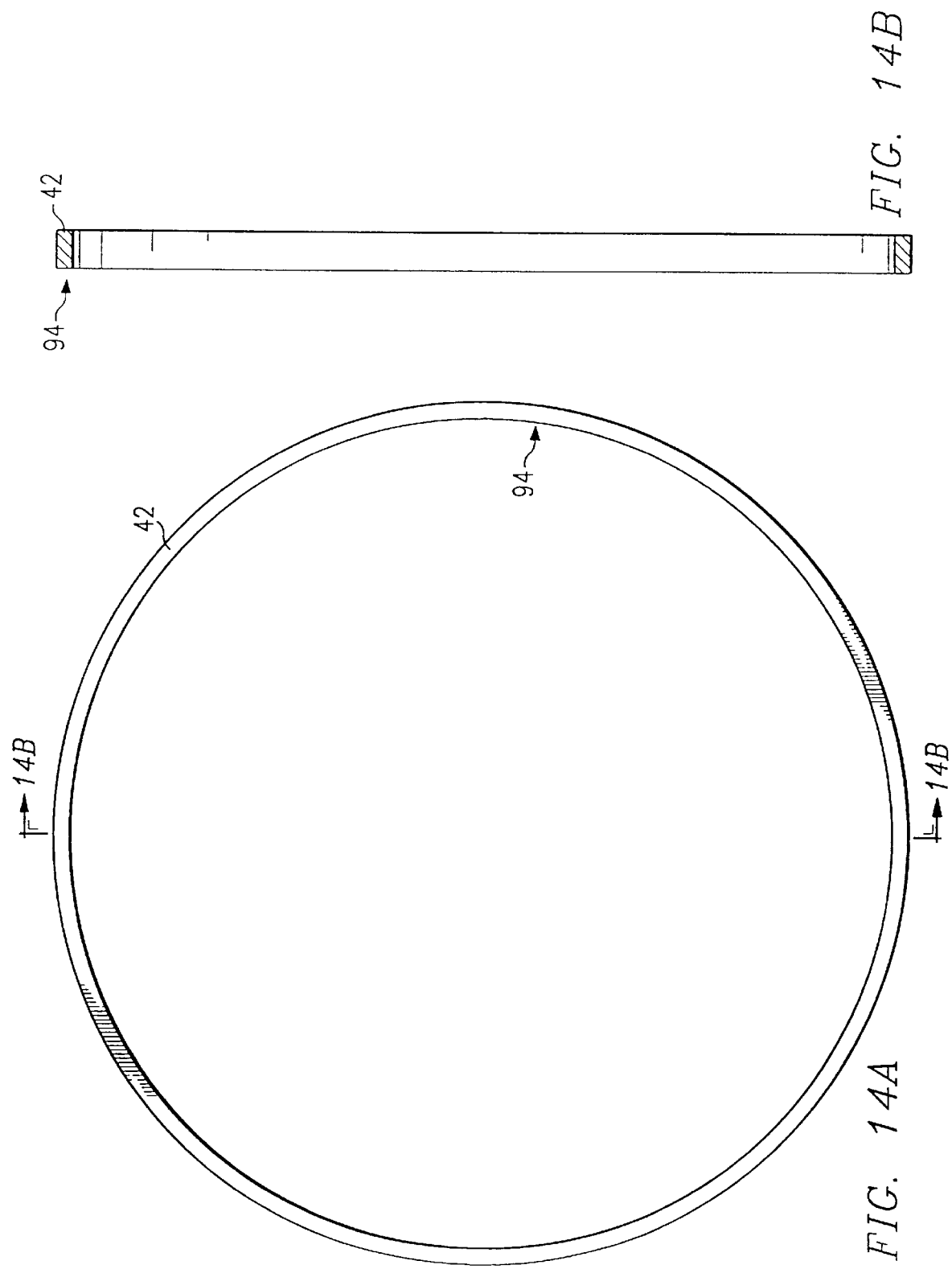

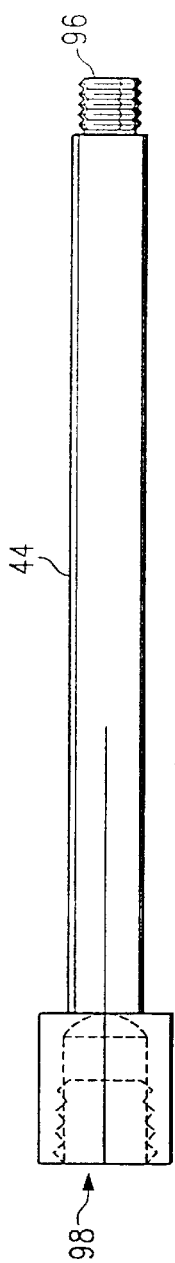
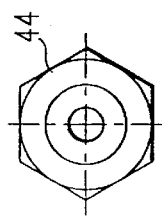
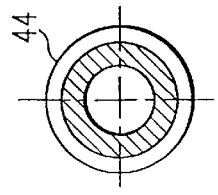
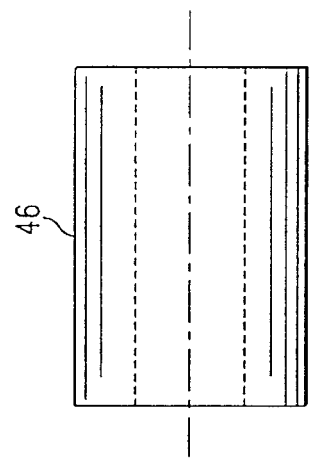
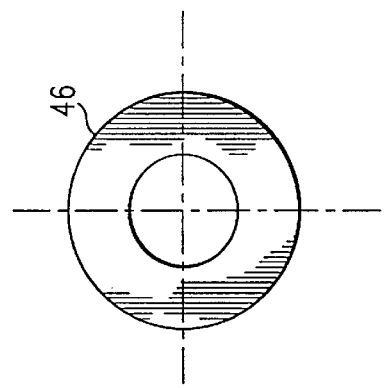

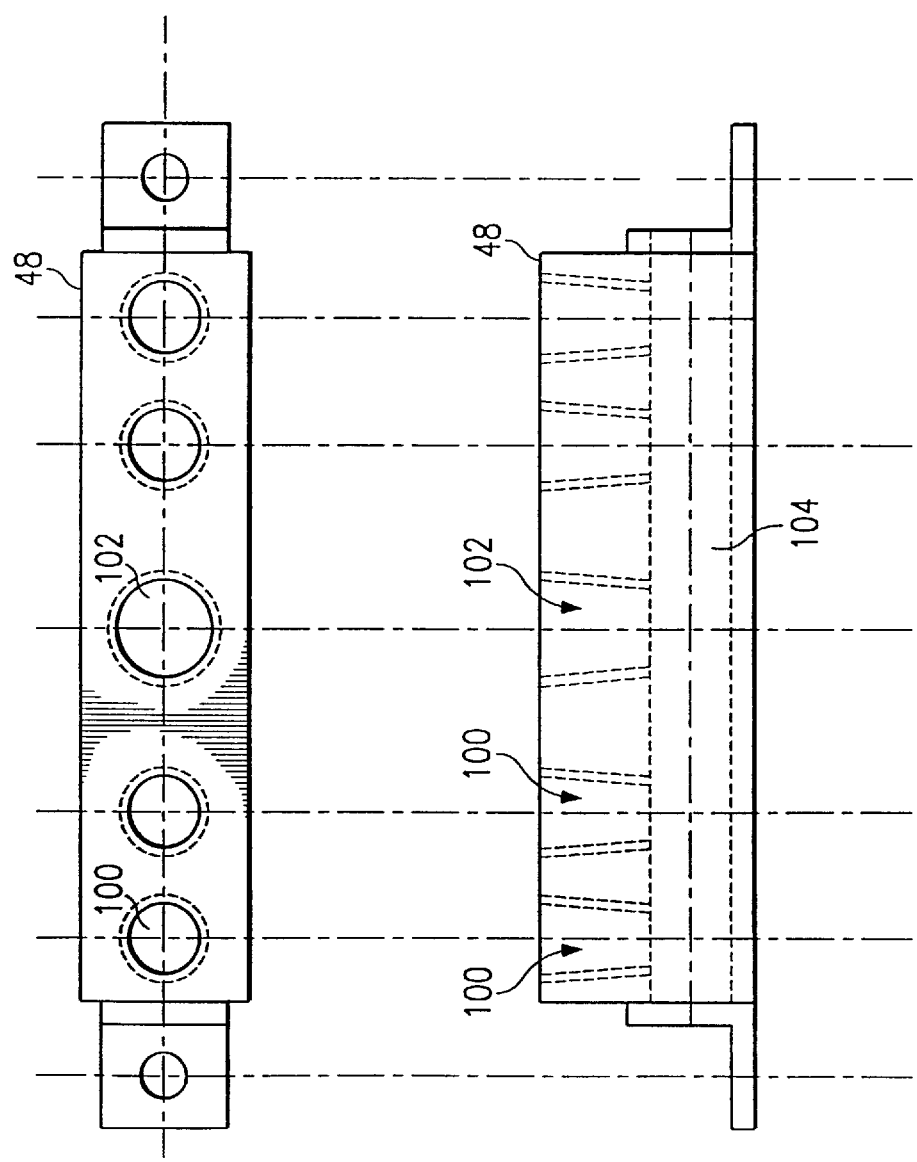

5,876,573

HIGH MAGNETIC FLUX CATHODE APPARATUS AND METHOD FOR HIGH PRODUCTIVITY PHYSICAL-VAPOR DEPOSITION

RELATED APPLICATION

This application claims priority under 35 USC § 119(e)(1) to provisional application Ser. No. 60/000,852 filed Jul. 10, 1995.

TECHNICAL FIELD OF THE INVENTION

This invention relates in general to the field of magnetron sputtering systems, and more particularly to a high magnetic flux cathode apparatus and method for high productivity physical vapor deposition.

BACKGROUND OF THE INVENTION

The deposition of films using a magnetron sputtering system provides enhanced deposition rates through the creation of a magnetic field at the target surface. It is advantageous in magnetron sputtering systems to increase the magnetic field strength at the target surface. This can be especially true when the target is a magnetic material.

One barrier to the strength of the magnetic field is the backing plate upon which the target is bonded. The backing plate serves the purpose of cooling the target and providing part of the chamber wall for forming the vacuum chamber for deposition of the target onto a substrate. In conventional systems, the backing plate experiences a pressure differential from the vacuum chamber to atmospheric pressure. This pressure places limits on the material properties of the backing plate.

Conventional systems have attempted to increase the magnetic field at the target using a number of methods. Some conventional systems have attempted to strengthen the magnetic field at the target by decreasing the thickness of the backing plate and using a center post to support the backing plate. However, bowing, deflection and buckling of the backing plate can still be caused by the pressure differential between the vacuum inside the chamber and atmospheric pressure outside the chamber.

SUMMARY OF THE INVENTION

In accordance with the present invention, a high magnetic flux cathode apparatus and method for high productivity physical vapor deposition is provided that substantially eliminates or reduces disadvantages and problems associated with previously developed magnetron sputtering systems.

According to one embodiment of the present invention, a magnetron sputtering system is provided that includes a backing plate with cooling channels. The magnetron sputtering system also generates low pressure region in the magnetron assembly such that the backing plate sees a pressure differential much lower than atmospheric pressure. The backing plate is reduced in thickness and provides less of a barrier to the generated magnetic field on the target.

A technical advantage of the present invention is the thinning of the backing plate to provide less of a barrier to the magnetic field generated by the magnet array, thus increasing the magnetic field seen by the target. This is accomplished through the decrease of the pressure differential seen by the backing plate.

A further technical advantage of the present invention is the use of a cooling fluid to cool the backing plate and the target by circulating the cooling liquid through cooling channels in the magnetron assembly.

An additional technical advantage of the present invention is the use of low-vapor-pressure liquid in the magnetron assembly so that the liquid does not evaporate at the lower pressures therein.

Still another technical advantage of the present invention is the use of low pressure region in conjunction with a thin backing plate to reduce buckling, bowing and deflection of the backing plate.

BRIEF DESCRIPTION OF THE DRAWINGS

A more complete understanding of the present invention and advantages thereof may be acquired by reference to the following description taken in conjunction with the accompanying drawings in which like reference numbers indicate like features and wherein:

FIGS. 4A, 4B, 4C and 4D are top, cross-sectional, bottom, and partial views of the coolant inlet/out manifold of the magnetron sputtering system;

FIGS. 7A and 7B are top and cross-sectional views of a first insulator ring of the magnetron sputtering system;

FIGS. 8A and 8B are top and cross-sectional views of a second insulator ring of the magnetron sputtering system;

FIGS. 9A, 9B and 9C are top, cross-sectional and partial views of the anode ring of the magnetron sputtering system;

FIGS. 10A, 10B, 10C, 10D and 10E are top, partial, cross-sectional, side and zoomed views of the magnet assembly housing of the magnetron sputtering system;

FIGS. 11A and 11B are top and cross-sectional views of a third insulator ring of the magnetron sputtering system;

FIGS. 12A and 12B are top and cross-sectional views of the bearing retainer of the magnetron sputtering system;

FIGS. 14A and 14B are top and cross-sectional views of the spacer ring of the magnetron sputtering system;

FIGS. 15A, 15B, and 15C are cross-sectional and partial views of the conduit tube of the magnetron sputtering system;

FIGS. 16A and 16B are top and side views of the jacket insulator of the magnetron sputtering system;

FIGS. 17A, 17B and 17C are top and cross-sectional views of the inlet/outlet manifold of the magnetron sputtering system.

DETAILED DESCRIPTION OF THE INVENTION

Figure 1:
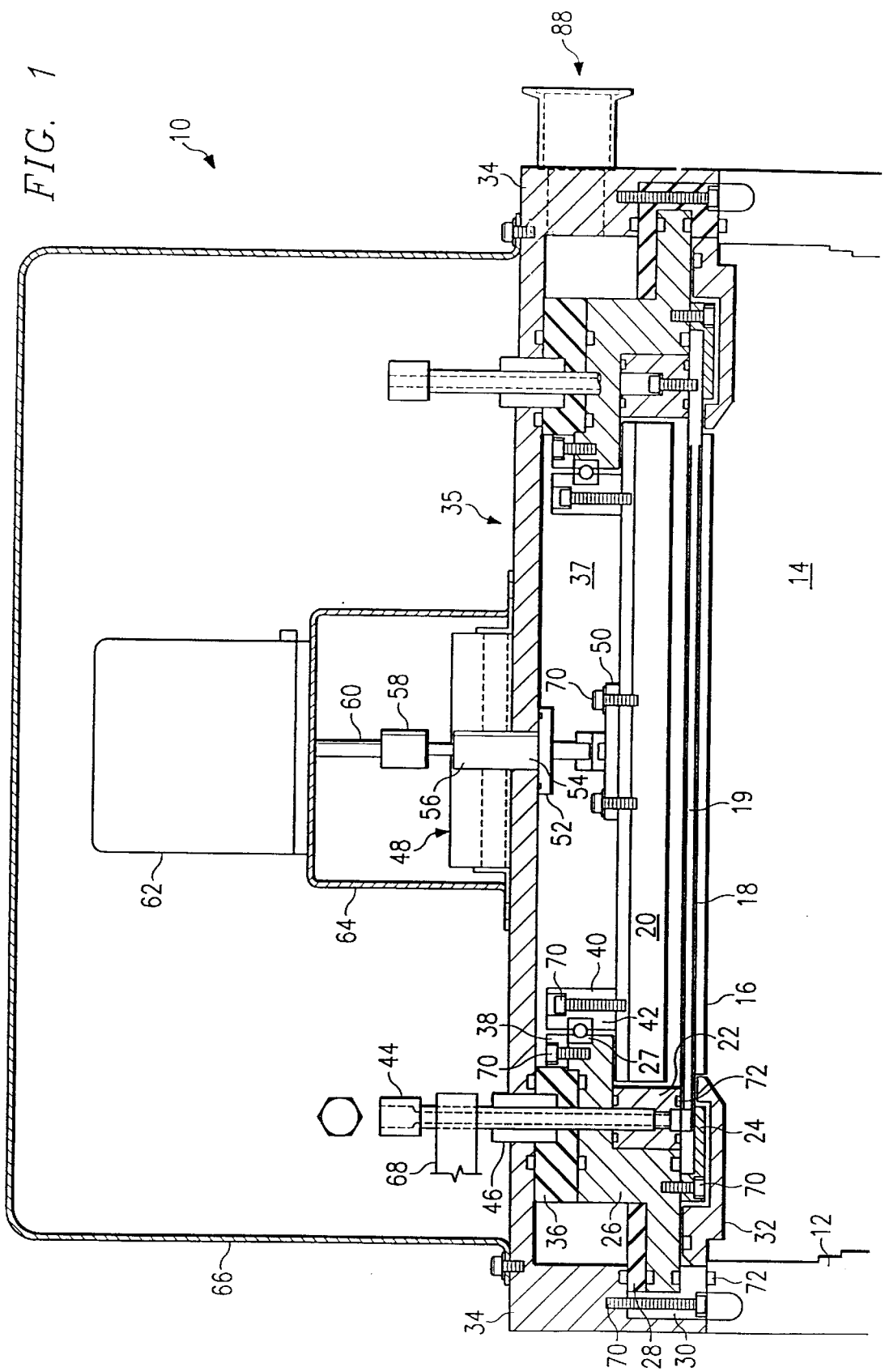
FIG. 1 is a cross-sectional view of one embodiment of a magnetron sputtering system, constructed according to the teachings of the present invention.

FIG. 1 is a cross-sectional view of a magnetron sputtering system, indicated generally at 10, constructed according to the teachings of the present invention. System 10 is used to perform sputtering of target material from a target onto a substrate.

Chamber walls 12 define a vacuum deposition chamber 14. Chamber walls 12 are constructed from a metal material capable of supporting the evacuated state. A target 16 is positioned within vacuum chamber 14 and is mounted to a target backing plate 18. Target backing plate 18 should preferably be constructed from copper. Backing plate 18 includes conduits 19, as are described in more detail below.

The backing plate 18 can be coupled to target 16 by means of a bonding process. The bonding process should preferably be a low-temperature, for example, less than 200 degrees Celsius, bonding process to allow de-bonding of the backing plate 18 from a used target 16. This allows the backing plate 18 to be re-used. An indium bonding process can accomplish this aim of allowing de-bonding of the target 16 from the backing plate 18 to allow re-use of backing plate 18.

A magnet array assembly 20 is positioned above backing plate 18 and target 16, as shown. Magnet array assembly 20 provides the magnetron enhancement of physical vapor deposition in chamber 14. One embodiment of a magnet array assembly is disclosed and described in U.S. Pat. No. 5,248,402, the disclosure of which is incorporated herein by reference.

Backing plate 18 includes conduits 19 that provide cooling channels to cool target 16 during the sputtering process. In one embodiment of the present invention, backing plate 18 serves as a cathode for creating plasma within chamber 14. To create a plasma cathode, electrically-conductive backing plate 18 can be coupled to either a D.C. source or a radio frequency (RF) source. Backing plate 18 can couple to the DC or RF energy source via conduit tubes 44. For example, FIG. 1 shows backing plate 18 connected to an RF source by means of an RF strap 68. Because the chamber walls 12 provide system ground, backing plate 18 must be electrically isolated from chamber walls 12 when backing plate 18 serves as a cathode.

A coolant manifold 22 is positioned proximate backing plate 18 such that coolant manifold 22 connects to conduits 19. Coolant manifold 22 provides a coupling means for providing fluid communication to conduits 19. The structure of one embodiment of coolant manifold 22 is described in more detail below.

Backing plate 18 is held in place by retainer ring 24 which is coupled to a bearing support 26, as shown. Bearing support 26 also provides support for a bearing 27. In one embodiment of the present invention, bearing 27 is a KAY-DON bearing, part number KD100XPO. A first insulator ring 28, and a second insulator ring 30, couple between bearing support 26 and chamber walls 12, while isolating the metal bearing support 26 from metal chamber walls 12. A third insulator ring 36 couples between bearing support 36 and magnetron assembly housing 34. For embodiments of the present invention that include energizing backing plate 18 to form a cathode, backing plate 18 and all associated structures (an example being the bearing support 26) must be electrically isolated from chamber walls 12. Insulator rings 28 and 30, made from a non-conductive, elastomer material, effectively isolate bearing support 26 (and therefore cathode backing plate 18) from ground (the chamber walls and the magnetron assembly housing).

An anode ring 32 is positioned inside chamber 14 along the upper inner edge of chamber wall 12 as shown. Anode ring 32 serves as an anode for system 10 and is grounded through contact with chamber wall 12. In one embodiment of the present invention, anode ring 32 is constructed from aluminum. Anode ring 32 is electrically isolated from backing plate 18. This isolation can be accomplished either through use of an insulator or an open air space as shown in FIG. 1.

A magnetron assembly housing 34, in contact with chamber walls 12, is coupled to first and second insulator rings 28 and 30, opposite bearing support 26. Magnetron assembly housing 34 provides a housing for the entire magnetron assembly 35 which sits on top of chamber 14. A third insulator ring 36 is positioned between magnetron assembly housing 34 and bearing support 26 to electrically isolate bearing support 26 and backing plate 18 from magnetron assembly housing 34.

A bearing retainer 38 is coupled to bearing support 26 and provides, along with bearing support 26, the outer race for bearing 27. A magnet holder 40 couples to magnet array assembly 20 and provides part of an inner race for bearing 27 as well as supporting magnet array assembly 20. A spacer ring 42 is positioned proximate magnet holder 40 and provides the remaining portion of the inner race for bearing 27, as shown.

A conduit tube 44 extends through magnetron assembly housing 34, third insulator ring 36, bearing support 26, and into coolant manifold 22, as shown. Conduit tube 44 provides fluid communication to conduits 19 of backing plate 18. Conduit tube 44 couples to coolant manifold 22 to provide the ability to pump fluid into and out of cooling channels provided by conduits 19 of backing plate 18. In one embodiment of the present invention, there are eight conduit tubes 44 coupled to coolant manifold 22, as described in more detail below. An insulating jacket 46 electrically insulates conduit tube 44 from magnetron assembly housing 34, as shown.

In one embodiment of the present invention, the conduit tubes 44 couple to an electrical source such as an RF or DC source, to provide an energy path to backing plate 18. The energized backing plate then provides a cathode for the magnetron sputtering system 10. In the illustrated embodiment, an RF strap 68 is coupled to conduit tube 44 to provide an RF source to backing plate 18. In other embodiments, a DC source can couple to one or more conduit tubes 44 to provide a DC source for creation of plasma within chamber 14. Generally, a DC source is used where target 16 is a conductive material, and an RF source is used where target 16 is a semiconductor or insulating material.

An inlet/outlet manifold 48 is coupled to magnetron assembly housing 34. Inlet/outlet manifold 48 comprises inlets and outlets which are in fluid communication. Inlet/outlet manifold 48 is connectable in fluid communication with each conduit tube 44 and conduit 19 such that coolant can be pumped into and out of the cooling channels.

A plate 50 is coupled to magnet array assembly 20, and a plate 52 is coupled to magnetron assembly housing 34, as shown. A sealed rotating shaft 54 extends through plate 52 and is coupled to plate 50 to provide rotation of magnet array assembly 20. As shown, a ferrofluidic feed-thru 56 allows the shaft of sealed rotating shaft 54 to extend through magnet assembly housing 34 without compromising the seal. A coupling 58 connects rotating shaft 54 with shaft 60 of motor 62. In one embodiment of the present invention, coupling 58 comprises an OLDHAM coupling.

A number of fastening devices 70 are used to couple pieces of system 10 together, as shown. In the illustrated embodiment, fastening devices 70 comprise screws of various sizes, although other fastening devices could be used. In addition, various sealing devices 72 provide sealing of chamber 14 and of the inside of the magnetron assembly 35 from outside atmospheric pressure. In the illustrated embodiment, sealing devices 72 comprise elastomer seals, although other sealing devices could be used.

In operation, magnetron sputtering system 10 operates to sputter material from target 16 into chamber 14. A plasma is generated in chamber 14 such that physical vapor deposition of the material sputtered from target 16 occurs. Magnetron sputtering system 10 provides magnetron enhancement of the sputtering process.

According to the present invention, the magnetron assembly housing is formed to enclose the manget array assembly 20 and form a space, or the magnet array chamber 37, within the magnetron assembly housing. Magnet array chamber 37 comprises the space within magnetron assembly 35 that lies above backing plate 18. In operation, the pressure within the magnet array chamber can be reduced to a pressure much lower than atmospheric pressure. This reduction in pressure can be accomplished by operating a pump through pump port 88 that connects to magnet array chamber 37. In one embodiment of the present invention, the lower pressure ranges from 10 to 100 Torr in the magnet array chamber 37. During operation, chamber 14 is a vacuum, the magnet array chamber 37 is at subatmospheric pressure, and the remainder of system 10 is at atmospheric pressure.

The backing plate 18 will, therefore, experience pressure in the vacuum chamber on the target side of the backing plate 18, while at the same time the backing plate 18 will experience pressure force from within the magnet array chamber 37 on the magnet array assembly side of the backing plate. According to the teachings of the present invention, backing plate 18 sees a lower pressure differential due to the decrease in pressure within the magnet array chamber 37. This decrease in pressure differential will decrease the deflection force on the backing plate 18. This allows backing plate 18 to be decreased in thickness without experiencing the level of buckling, bowing, and deflection that would occur if the backing plate saw a more severe pressure differential. A thinner backing plate provides less of a barrier to the magnetic field generated by magnet array assembly 20.

The reduction of the thickness of backing plate 18 provides enhanced penetration of the magnetic field generated by magnetic array assembly 20. This enhanced strength of the magnetic field increases the effectiveness of magnetron sputtering system 10, and provides increased deposition rates and better utilization of target 16. In addition, the provision of cooling channels and the pumping of cooling liquid into and out of magnetron assembly 35 provides enhanced target cooling during operation. In the illustrated embodiment, cooling channels are provided by conduits 19.

Figure 2:
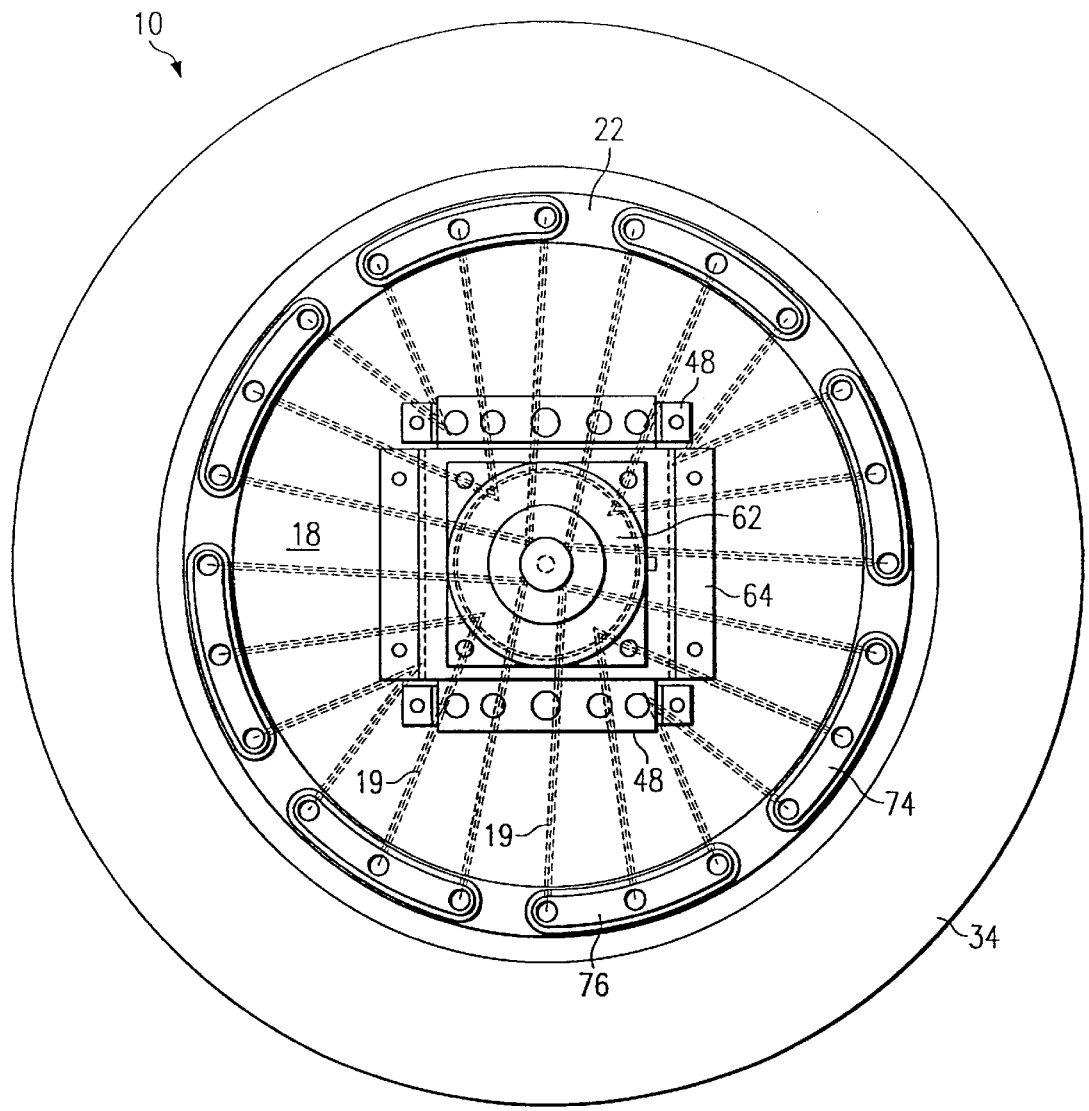
FIG. 2 is a top view of the magnetron sputtering system of FIG. 1.

FIG. 2 is a top view of the magnetron sputtering system 10 of FIG. 1. FIG. 2 illustrates an arrangement of conduits 19 in backing plate 18 and the connection of conduits 19 to coolant manifold 22. In the illustrated embodiment, twelve V-shaped conduits 19, each having an input end and an output end, are divided into eight groups which can include four input and four output groups. For example, collector region 74 and collector region 76 collect opposite ends of three pairs of connected conduits 19. Collector region 74 and collector region 76 can serve respectively as an inlet and as an outlet for coolant. Thus, for each set of three conduits 19, a coolant can flow into the conduits through inlet collector region 74, through the three V-shaped conduits 19, and exit through outlet collector region 76.

As shown in FIG. 2, two manifolds 48 are positioned on either side of motor 62. One inlet/out manifold 48 can be connected in fluid communication with each inlet collector region 74, and the other inlet/out manifold 48 can be connected in fluid communication with each outlet collector region 76. In this manner, one inlet line is used to pump coolant fluid into and one outlet line is used to pump coolant fluid out of conduits 19 in backing plate 18.

The thickness of backing plate 18 can be substantially reduced due to the decrease in the pressure differential seen by backing plate 18 and the cooling of backing plate 18 using cooling channels such as conduits 19. This provides enhancement of the operation of magnetron sputtering system 10.

Figure 3B:
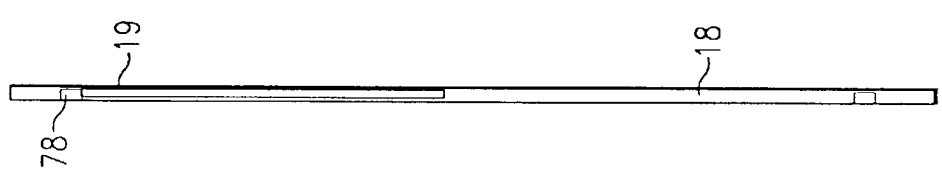
FIGS. 3A and 3B are a top and cross-sectional view of the backing plate of the magnetron sputtering system.
Figure 3A:
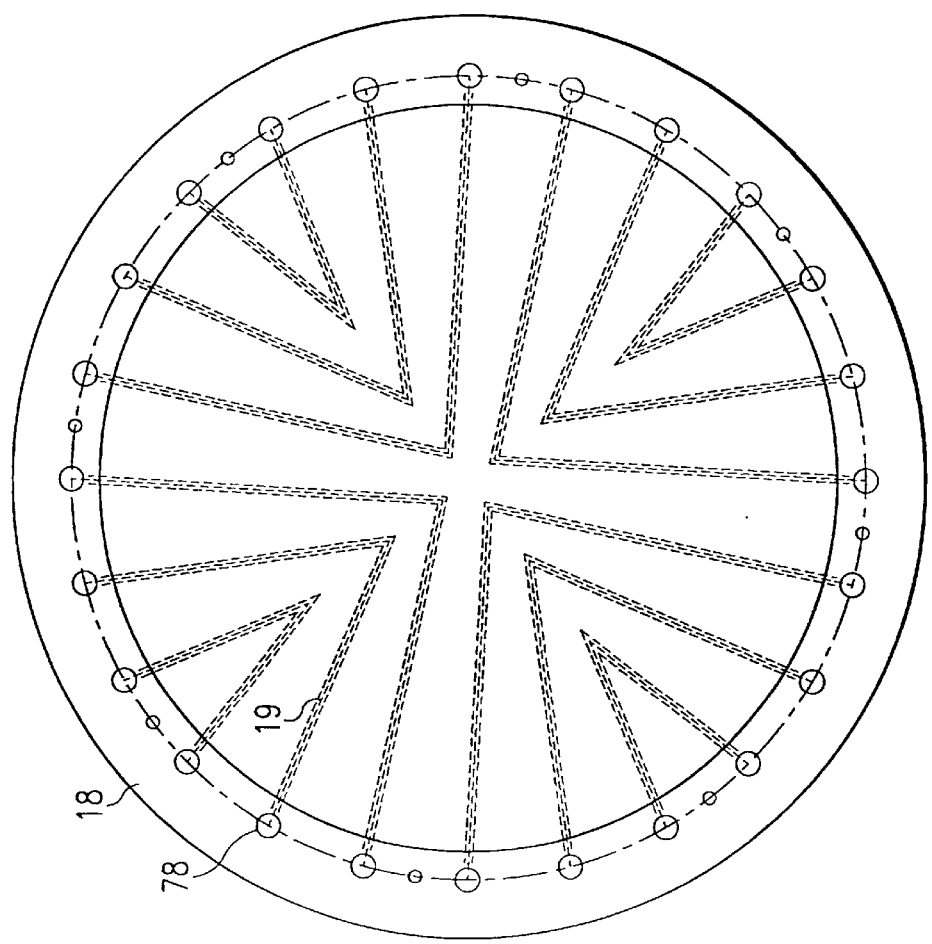

FIGS. 3A and 3B are top and cross-sectional views of backing plate 18. As shown in FIG. 3A, backing plate 18 comprises a number of conduits 19. In the illustrated embodiment, V-shaped conduits 19 are divided into four quadrants, with each quadrant having six holes 78 connecting to three conduits 19, respectively. In one embodiment of the present invention, conduits 19 are formed by drilling into backing plate 18 from the side. The conduits are then plugged and welded on the periphery, after which holes 78 are drilled from the top to connect to conduits 19. FIG. 3B shows the interconnection of holes 78 with conduits 19. In another embodiment of the present invention, conduits 19 are formed by cutting grooves in the top of backing plate 18 and mounting a plate over the grooves. Other suitable methods of forming conduits 19 are possible.

FIGS. 4A, 4B, 4C and 4D show top, cross-sectional, bottom and partial views of coolant manifold 22. In the embodiment illustrated in FIG. 4A, coolant manifold 22 comprises eight openings 80 on the top of coolant manifold 22. Each opening 80 is in fluid communication with a collector 82. Each opening 80 is also operable to connect to a conduit tube 44 to receive fluid from or to deliver fluid to the conduit tube 44. FIG. 4B shows eight collectors 82 on the bottom of coolant manifold 22. Each collector 82 includes an O-ring 84 for sealing coolant manifold 22 to backing plate 18 when assembled. Each collector 82 is operable to cover three of holes 78 on the top of backing plate 18. In this manner, fluid can be communicated to and from conduits 19 through the eight openings 80 on the top of coolant manifold 22. FIG. 4C shows an exploded partial view of the positioning of O-ring 84.

Figures 5A, 5B:
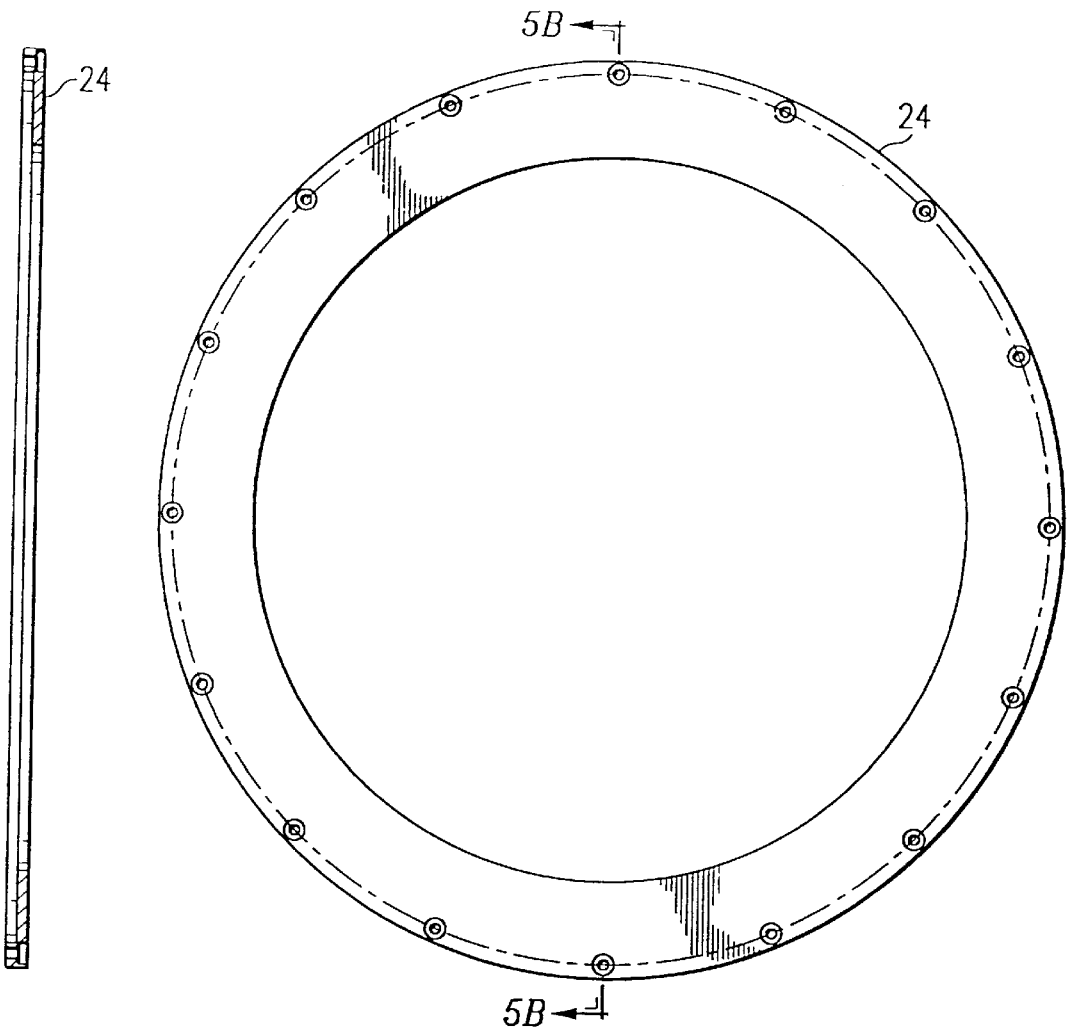
FIGS. 5A and 5B are top and cross-sectional views of the retainer ring of the magnetron sputtering system.

FIGS. 5A and 5B are top and cross-sectional views of retainer ring 24. In the illustrated embodiment, retainer ring 24 is constructed from stainless steel and has an L-shaped cross-section. Retainer ring 24 hold backing plate 18 in place.

Figure 6B:
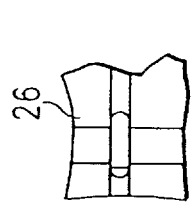
FIGS. 6A, 6B, 6C and 6D are top, partial, cross-sectional and perspective views of the bearing support of the magnetron sputtering system.
Figure 6D:
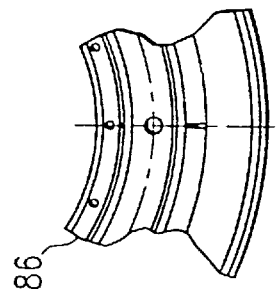
Figure 6A:
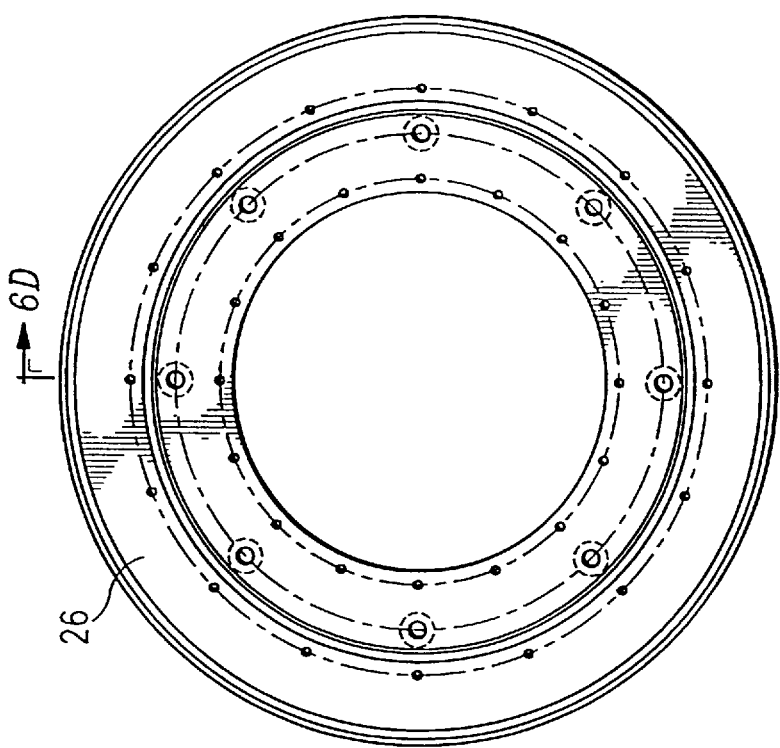
Figure 6C:
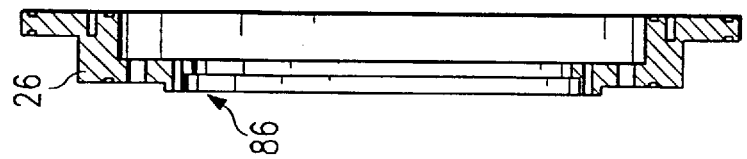

FIGS. 6A, 6B, 6C and 6D are top, partial, cross-sectional and perspective views of bearing support 26. Bearing support 26 provides an outer race 86 for bearing 27 as shown in FIG. 6C. FIG. 6B shows a view of the O-ring groove and venting for bearing support 26. In the illustrated embodiment of the present invention, bearing support 26 is constructed from an aluminum alloy.

FIGS. 7A and 7B are top and cross-sectional views of a first insulator ring 28. First insulator ring 28 should be constructed from a non-conductive material, such as an elastomer material. In one embodiment of the present invention, insulator ring 28 is constructed from a nylon material.

FIGS. 8A and 8B are a top and cross-sectional view of a second insulator ring 30. As shown in FIG. 8B, second insulator ring 30 has an L-shaped cross-section. Second insulator ring 30 is constructed from a suitable insulating material, such as nylon.

FIGS. 9A, 9B and 9C are a top, cross-section and partial view of anode ring 32. As shown in FIG. 9B, anode ring 32 has a somewhat reverse C shape. Anode ring 32 is constructed from an electrically-conductive metal material.

FIGS. 10A, 10B, 10C, 10D and 10E are top, partial, cross-sectional, side and zoomed views of magnetron assembly housing 34. In the illustrated embodiment of the present invention, magnetron assembly housing 34 is constructed from stainless steel and sealed to contain a subatmospheric state. As shown in FIG. 10A, magnetron assembly housing 34 comprises eight feedthroughs 86, through which conduit tubes 44 can extend. In addition, pump outlet 88 provides a port for lowering the pressure inside magnetron assembly 35 after magnetron sputtering system 10 is assembled. FIG. 10B shows a partial view of the O-ring groove and venting for magnetron assembly housing 34.

FIGS. 11A and 11B show top and cross-sectional views of the third insulator ring 36. In the illustrated embodiment of the present invention, third insulator ring 36 is constructed from nylon material. As shown in FIG. 11A, third insulator ring 36 comprises eight feedthrough openings 90 through which conduit tubes 44 can extend. Feedthrough openings 90 are wider at the top to receive insulating jacket 46. Insulator ring 36 serves, in part, to provide a seal for magnet array chamber 37.

Insulator rings 28, 30, and 36 work in tandem to insulate the backing plate 18 from chamber walls 12 and magnet assembly housing 34. These insulator rings operate to electrically isolate an RF or DC charged backing plate 18 from ground (chamber walls 12 and magnet assembly housing 34).

FIGS. 12A and 12B are top and cross-sectional views of bearing retainer 38 that provides an outer race for bearing 27. In the illustrated embodiment of the present invention, bearing retainer 38 is constructed from aluminum material.

Figure 13B:
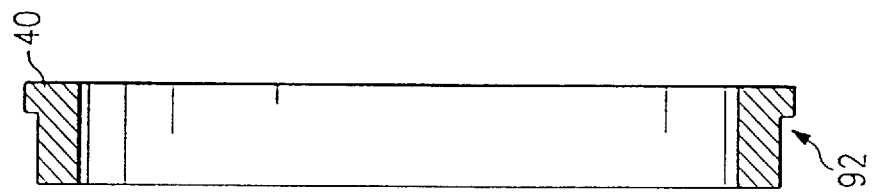
FIGS. 13A and 13B are top and cross-sectional views of the magnet holder of the magnetron sputtering system.
Figure 13A:
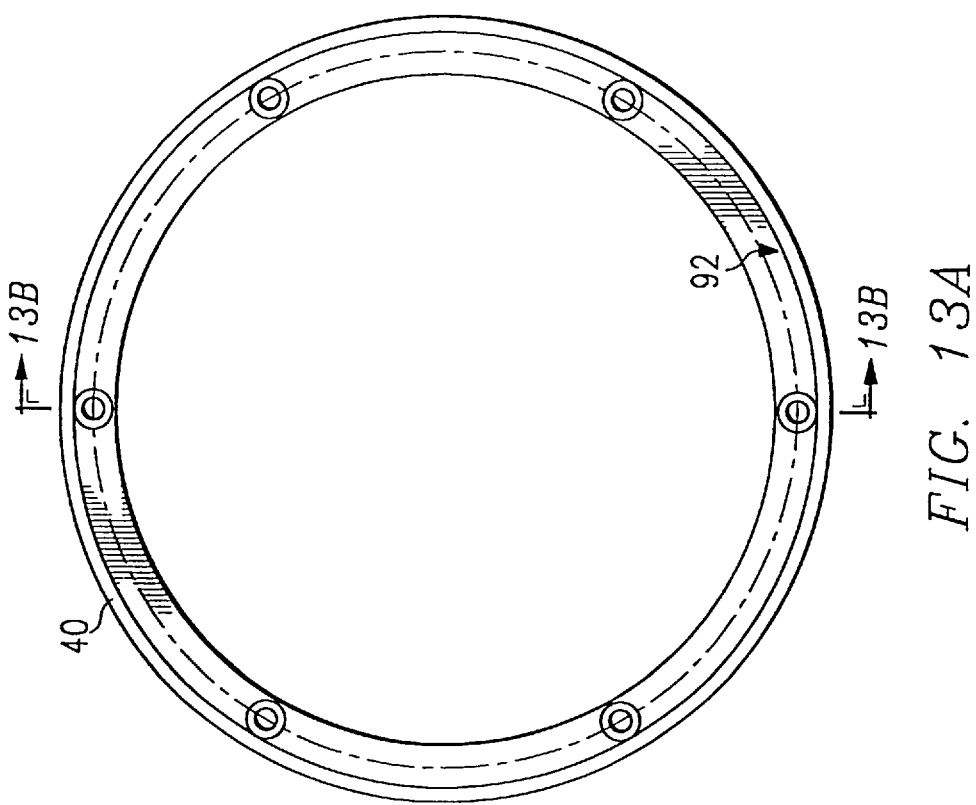

FIGS. 13A and 13B are top and cross-sectional views of magnet holder 40. In the illustrated embodiment of the present invention, magnet holder 40 is constructed from aluminum material. Magnet holder 40 provides a portion 92 of an inner race for bearing 27.

FIGS. 14A and 14B are top and cross-sectional views of spacer ring 42. Spacer ring 42 provides a remaining portion 94 of the inner race for bearing 27.

FIGS. 15A, 15B, and 15C are cross-sectional and exploded views of conduit tube 44. In one embodiment of the present invention, conduit tube 44 is constructed from copper. Conduit tube 44 comprises a first end 96 and a second end 98. First end 96 is operable to connect to coolant manifold 22. Second end 98 is operable to provide fluid communication to inlet/out manifold 48 for either pumping of cooling fluid into or out of backing plate 18. In the embodiment of FIG. 1, four conduit tubes 44 (inlet conduit tubes) supply coolant, through coolant manifold 22, to conduits 19 in backing plate 18, while four conduit tubes 44 (outlet conduit tubes) receive coolant exiting from conduits 19 in backing plate 18.

FIGS. 16A and 16B provide top and side views of insulating jacket 46. Insulating jacket 46 is constructed from insulating material to electrically isolate conduit tube 44 from magnet assembly housing 34.

FIGS. 17A, 17B and 17C are cross-sectional and top views of inlet/out manifold 48. In the illustrated embodiment of the present invention, inlet/out manifold 48 is constructed from aluminum and aluminum alloy as indicated. Inlet/out manifold 48 includes four conduit tube openings 100, and one inlet/outlet opening 102. Conduit tube openings 100 and inlet/outlet opening 102 are in fluid communication via conduit 104. Inlet openings 100 are operable to connect with four of conduit tubes 44. Outlet opening 102 is operable to connect in fluid communication with a pump for either pumping cooling fluid into or out of inlet/out manifold 48. As shown in the embodiment of FIG. 2, the system 10 includes two manifolds 48. One inlet/out manifold 48 (the inlet manifold) couples (by means of a tubing) to the four inlet conduit tubes 44, while the other inlet/out manifold 48 (the outlet manifold) couples to the four outlet conduit tubes 44 via conduit tube openings 100.

In operation, coolant flows into inlet/outlet manifold 48 through inlet/outlet opening 102 from a coolant source (not shown), flows via conduit 104 to conduit tube openings 100, and into inlet conduit tubes 44. The coolant then flows from inlet conduit tubes 44, through coolant manifold 22, into conduits 19 (serving as cooling channels) through inlet collection region 74. Coolant flows through conduits 19, exits backing plate 18 through outlet collector region 76, flows through coolant manifold 22, into the four outlet conduit tubes 44. Coolant flows through the four outlet conduit tubes 44 into the four conduit tube openings 100 of inlet/outlet manifold 48. The coolant then mixes in conduit 104 and exits inlet/outlet manifold 48 through inlet/outlet opening 102.

Figure 18:
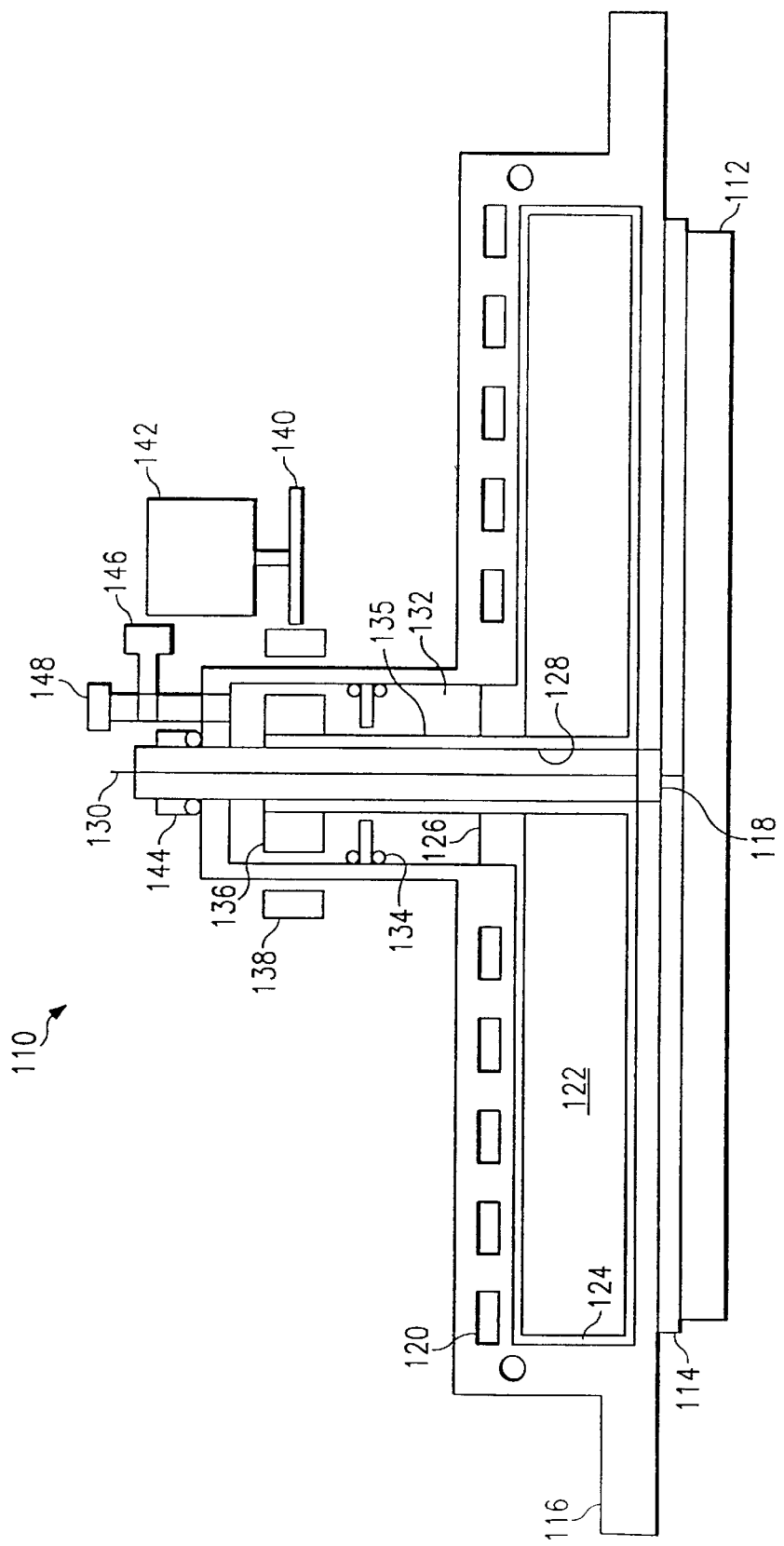
FIG. 18 is a schematic view of another embodiment of a magnetron sputtering system constructed according to the teachings of the present invention.

FIG. 18 illustrates another embodiment of a magnetron sputtering system, indicated generally at 110. Magnetron sputtering system 110 comprises a bonded target 112 that can be a high utilization target. An insulator disk 114 is positioned between target 112 and magnet assembly housing 116. Insulator disk 114 can comprise an AlN insulator disk for an ultra-high vacuum design. An electrical feedthrough 118 is positioned at the center of insulator disk 114 to provide electrical connection to target 112.

Magnet assembly housing 116 includes cooling channels 120. As shown, cooling channels 120 are positioned above a magnet assembly 122. A space 124 is established between magnet assembly 122 and magnet assembly housing 116. Space 124 can be filled with liquid having a low-vapor-pressure to communicate cooling and heating by water in cooling channels 120 to target 112. The low-vapor-pressure liquid can comprise mercury or gallium such that the liquid does not evaporate at reduced pressure inside the assembly. This will provide complete liquid thermal contact between the magnet assembly housing 116 and insulation disk 114 for increased cooling. In this embodiment, the cooling channels 120 are formed in magnet assembly housing 116 instead of the backing plate.

With continued reference to FIG. 18, an electrical lead jacket 128 holds an electrical connection lead 130, as shown. Electrical connection lead 130 is coupled to electrical feedthrough 118 and to target 112. Space 132 surrounding electrical lead jacket 128 comprises a vacuum sealed space having a rough vacuum.

A bearing support 134 provides rotational bearing support for rotating tube 135 and magnet assembly 122. Wheel 136 is an inner multipolar wheel connected to rotating tube 135 connected to magnet assembly 122. A rotation drive 138 is coupled to wheel 136 and comprises a magnetically coupled rotation drive having a four-magnet multipolar ring. Gear drive 140 is coupled to rotation drive 138 and to a rotation motor 142, as shown. Rotation motor 142 can comprise a stepper motor.

A seal 144 provides a sealing surface for rotating tube 135. A valve 146 provides control for flow of air and liquid metal through port 148. Port 148 serves as both an entry for liquid metal and a vacuum pump inlet.

In operation, magnetron assembly 110 sputters material from target 112 into a vacuum chamber to allow deposition of the material on a wafer surface. Cooling channels 120 provide cooling of the assembly such that target 112 does not require contact to a backing plate.

The present invention provides a magnetron cathode assembly for increasing the magnetron sputtering rate and enhancing the productivity of physical vapor deposition tools. The magnetron sputtering rate is increased by reducing the thickness of the target backing plate and can be further increased by using an improved magnet array design. The present invention provides a cathode structure having a thin backing plate. In one embodiment of the present invention, the permanent magnet assembly is supported by a bearing inside an enclosed cavity above the target backing plate. The permanent magnet assembly cavity has a pump/vent port and a ferrofluidic feedthrough. The latter is for coupling rotation from an external motor to the magnet assembly. The pump port can be used to establish a low pressure (e.g. 10 to 100 Torr) ambient (e.g. air, nitrogen, etc.) within the magnet array chamber in order to reduce the differential pressure across the target backing plate from atmospheric pressure down to the lower pressure established. This allows the thickness of the backing plate to be reduced without causing excessive bowing of the backing plate. Target cooling can be accomplished using cooling channels embedded within the backing plate such as the conduits described above. In an alternative embodiment, the cooling channels can be built into the top of the magnetron housing. The housing can be filled with a low-vapor-pressure thermally conductive liquid to cool the target, thereby eliminating the requirement of having a backing plate.

Although the present invention has been described in detail, it should be understood that various changes, substitutions and alterations can be made hereto without departing from the spirit and scope of the invention as defined by the appended claims.

What is claimed is:

1. A magnetron sputtering system for sputtering a material from a target onto a substrate contained within a vacuum chamber, the vacuum chamber having a pressure, the system comprising:

a magnet array assembly;

a magnetron assembly housing enclosing the magnet array assembly to form a magnet array chamber, the magnet array chamber operable to maintain a subatmospheric pressure;

a motor cooperating with the magnet array assembly through the magnetron assembly housing;

a backing plate coupled to the magnet array chamber and operable to hold the target during sputtering operation, the backing plate subject to the pressure in the vacuum chamber on a side of the backing plate proximate the target, and subject to subatmospheric pressure in the magnet array chamber on a side proximate the magnet array assembly;

a pump port coupled to the magnet array chamber, the pump port operable to allow a reduction in pressure in the magnet array chamber to decrease a pressure differential between the magnet array chamber and the vacuum chamber to reduce the deflection force on the backing plate, thereby allowing the use of a reduced thickness backing plate to enhance the magnetic field at the target; and V-shaped cooling channels formed within the backing plate that provide passages to circulate a coolant to cool the target during sputtering operation.

2. The system of claim 1 wherein the backing plate is not electrically charged to allow a direct backing plate to chamber wall vacuum seal for the magnet array chamber.

3. The system of claim 2, further comprising at least one insulator to electrically isolate the charged backing plate and to provide a vacuum seal for the magnet array chamber, and wherein the backing plate is electrically charged to provide a cathode for the sputtering system.

4. The system of claim 1 wherein each V-shaped cooling channel comprises two legs forming a V-shape, a base at the bottom of the V-shape where the two legs meet, and a top opposite the base, and further wherein the base of each V-shaped cooling channel is located proximate an inner portion of the backing plate and the top of the V-shaped cooling channel is located proximate an outer periphery of the backing plate.

5. The system of claim 1 wherein each V-shaped cooling channel is operable to accept coolant from an opening at one leg at the top of the V-shaped cooling channel, flow the coolant through the base of the V-shaped cooling channel, and emit coolant from a second opening at the top of the second leg of the V-shaped cooling channel.

6. The system of claim 1 wherein the backing plate further comprises four quadrants and a plurality of consecutively sized V-shaped cooling channels where an equal number of consecutively sized V-shaped cooling channels reside in each of the four quadrants.

7. The system of claim 6, further comprising a plurality of inlet conduit tubes and a plurality of outlet conduit tubes operable to provide coolant to the backing plate, the plurality of inlet conduit tubes and a plurality of outlet conduit tubes in fluid communication with the V-shaped cooling channels.

8. The system of claim 7, further comprising;

a coolant manifold coupled to the backing plate and to the conduit tubes, the coolant manifold having at least one inlet collector region through which coolant flows from the inlet conduit tubes into the V-shaped cooling channels and at least one outlet collector region through which coolant flows out of the backing plate V-shaped cooling channels into the outlet conduit tubes.

9. The system of claim 8, further comprising:

a first manifold coupled to the inlet conduit tubes, the first manifold operable to receive coolant and transfer coolant to the inlet conduit tubes; and a second manifold coupled to the outlet conduit tubes, the second manifold operable to receive coolant from the outlet conduit tubes after the coolant have been flowed through the cooling channels.

10. The system of claim 9 wherein the first and second manifolds further comprise an opening and a plurality of conduit tube openings in fluid communication via a conduit, and further wherein the system cools the target by having the coolant flow into the first manifold through the opening, into the conduit to the plurality of conduit tube openings, through the inlet conduit tubes to the coolant manifold, through the inlet collector of the coolant manifold into the cooling channels, through the cooling channels and exiting the backing plate through the outlet collectors, through the coolant manifold into the outlet conduit tubes, through the outlet conduit tubes into the conduit tube openings of the second manifold, into the conduit and exiting the second manifold through the opening.

11. The system of claim 6 wherein the V-shaped cooling channels are formed by drilling into the backing plate from the side of the backing plate.

12. The system of claim 6 wherein the V-shaped cooling channels are formed by machining grooves into the backing plate.

13. The system of claim 6, further comprising a plurality of conduit tubes, the conduit tubes operable to provide coolant to the backing plate, and the conduit tubes further operable to electrically connect the backing plate to an electrical source, thereby forming a cathode from the electrically charged backing plate.

14. The system of claim 13 wherein the electrical source is a DC source.

15. The system of claim 13 wherein the electrical source is an RF source.

16. The system of claim 13, further comprising at least one insulator to electrically isolate the charged backing plate from the chamber walls.

17. The system of claim 1 wherein the backing plate is coupled to the target using a bonding process performed at a temperature that will allow the backing plate to be de-bonded from the target when the target needs to be replaced to allow re-use of the backing plate.

18. A system for cooling a target in a magnetron sputtering system for sputtering a material onto a substrate contained within a vacuum chamber, the system comprising:

a target; and a backing plate coupled to the target, the backing plate comprised of a single piece of a material, the backing plate having V-shaped cooling channels imbedded within its interior, the cooling channels operable to circulate a coolant to provide cooling to the target during sputtering operation.

19. The system of claim 18, further comprising a plurality of conduit tubes operable to provide coolant to the backing plate, the plurality of conduit tubes in fluid communication with the cooling channels.

20. The system of claim 19, further comprising;

a first manifold coupled to a plurality of inlet conduit tubes, the first manifold operable to receive coolant from a coolant source and to transfer coolant to the inlet conduit tubes;

a second manifold coupled to a plurality of outlet conduit tubes, the second manifold operable to receive coolant from the outlet conduit tubes after the coolant has been flowed through the V-shaped cooling channels; and wherein the first and second manifolds further comprise an opening and a plurality of conduit tube openings in fluid communication via a conduit, and further wherein the system cools the target by having the coolant flow into the first manifold through the opening, into the conduit to the plurality of conduit tube openings, through the inlet conduit tubes to the coolant manifold, through an inlet collector of the coolant manifold into the V-shaped cooling channels, through the V-shaped cooling channels to exit the backing plate through a plurality of outlet collectors, through the second coolant manifold into the outlet conduit tubes, through the outlet conduit tubes into the conduit tube openings of the second manifold, into the conduit and exiting the second manifold through the opening.

21. The system of claim 18, wherein each V-shaped cooling channel is formed to have a base of the V-shaped cooling channel proximate an inner portion of the backing plate and a top of the V-shaped cooling channel proximate an outer periphery of the backing plate, and wherein each V-shaped cooling channel is operable to accept coolant from a first opening at the top, to flow the coolant through the base of the V-shaped cooling channel, and to emit coolant from a second opening at the top.

22. The system of claim 18 wherein the backing plate contains a plurality of consecutively sized V-shaped cooling channels, wherein an equal number of consecutively sized cooling channels reside in each of four quadrants of the backing plate.

23. The system of claim 19 wherein the cooling channels are formed by drilling into the backing plate from the side of the backing plate.

24. The system of claim 19, wherein the plurality of conduit tubes are operable to provide coolant to the backing plate, and the conduit tubes further operable to electrically connect the backing plate to an electrical source, thereby forming a cathode from the electrically charged backing plate.

25. The system of claim 24 wherein the electrical source is a DC source.

26. The system of claim 24 wherein the electrical source is an RF source.

27. The system of claim 24, further comprising at least one insulator to electrically isolate the charged backing plate from the chamber walls.

28. The system of claim 18 wherein the backing plate is coupled to the target using a bonding process performed at a temperature that will allow the backing plate to be de-bonded from the target when the target needs to be replaced to allows re-use of the backing plate.

29. A method for cooling a target in a magnetron sputtering system for sputtering a material from a target onto a substrate contained within a vacuum chamber, the method comprising the steps of:

forming V-shaped cooling channels in a backing plate by drilling from the sides of the backing plate;

coupling the backing plate to the target; and flowing a coolant through the cooling channels during sputtering operation.

30. The method of claim 29, further comprising the step of placing a plurality of conduit tubes in fluid communication with the V-shaped cooling channels to provide coolant to the backing plate.

31. The method of claim 30, further comprising the steps of:

coupling a coolant manifold in fluid communication between the backing plate and the conduit tubes;

flowing coolant from a plurality of inlet conduit tubes to an inlet collector region of the coolant manifold;

flowing coolant from an inlet collector region of the coolant manifold into the cooling channels of the backing plate;

flowing coolant through the cooling channels to an outlet collector region of the coolant manifold;

flowing coolant through the outlet collector region of the coolant manifold into a plurality of outlet conduit tubes;

coupling a first manifold to the inlet conduit tubes;

coupling a second manifold to the outlet conduit tubes; and cooling the target by flowing coolant into the first manifold through an opening in the first manifold, into the conduit to a plurality of conduit tube openings, through the inlet conduit tubes to the coolant manifold, through a plurality of inlet collector of the coolant manifold into the V-shaped cooling channels, through the V-shaped cooling channels and exiting the backing plate through a plurality of outlet collectors, through the coolant manifold into the outlet conduit tubes, through the outlet conduit tubes into a plurality of conduit tube openings of the second manifold, into the conduit and exiting the second manifold through the opening.

32. The method of claim 29, further comprising the steps of:

forming each V-shaped cooling channel to have two legs, a base formed at the junction of the two legs, and a top opposite the base, where the base is proximate an inner portion of the backing plate and the top is proximate an outer periphery of the backing plate, and wherein each V-shaped cooling is operable to accept coolant from a first opening in fluid communication with one of the two legs at the top of the V-shaped channel, to provide a flow path for the coolant through the base of the V-shaped-cooling, and to emit coolant from the top of the second leg in fluid communication with a second opening.

33. The method of claim 29, further comprising the step of:

forming the backing plate to contain a plurality of consecutively sized V-shaped cooling channels, wherein an equal number of consecutively sized cooling channels reside in each of four quadrants of the backing plate.

34. A method for enhancing the magnetic field at a target in a magnetron sputtering system for sputtering a material onto a substrate contained within a vacuum chamber having a pressure, the method comprising the steps of:

forming a magnet array chamber to enclose a magnet array assembly such that the magnet array chamber is operable to maintain a subatmospheric pressure;

coupling a motor to the magnet array assembly with a shaft running through the magnet array chamber, the motor being removed from the subatmospheric pressure of the magnet array chamber;

coupling a backing plate to the target, thereby subjecting a target side of the backing plate to the pressure in the vacuum chamber and a magnet array side of the backing plate to the subatmospheric pressure in the magnet array chamber the difference between the vacuum chamber pressure and the subatmospheric pressure defining a pressure differential; reducing the pressure in the magnet array chamber below atmospheric pressure to decrease the pressure differential between magnet array chamber and the vacuum chamber, such that the deflection force on the backing plate is reduced, thereby allowing the use of a reduced thickness backing plate to enhance the magnetic field at the target;

forming a plurality of V-shaped cooling channels within the backing plate having two legs, a base formed at the juncture of the two legs, and a top proximate the base, by drilling from the sides of the backing plate, wherein each V-shaped cooling channel is formed such that the base is proximate an inner portion of the backing plate and the top is proximate an outer periphery of the backing plate, and wherein each V-shaped cooling channel is operable to accept coolant through one leg at the top of the V-shaped cooling channel, to flow the coolant through the base of the V-shaped cooling channel, and to emit coolant from the second leg at the top of the V-shaped cooling channel;

coupling a coolant manifold to the backing plate, the coolant manifold having at least one inlet collector region through which coolant flows from a plurality of inlet conduit tubes into the V-shaped cooling channels and at least one outlet collector region through which coolant flows out of the backing plate V-shaped cooling channels into a plurality of outlet conduit tubes; and flowing a coolant through the V-shaped cooling channels to cool the target during sputtering operation.

* * * * *